(12) United States Patent
Ramm

(10) Patent No.: US 11,485,543 B2
(45) Date of Patent: Nov. 1, 2022

(54) PERMEATION BARRIER LAYER

(71) Applicant: Oerlikon Trading AG, Truebbach, Truebbach (CH)

(72) Inventor: Jurgen Ramm, Maienfeld (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 544 days.

(21) Appl. No.: 14/147,743

(22) Filed: Jan. 6, 2014

(65) Prior Publication Data
US 2014/0120456 A1    May 1, 2014

Related U.S. Application Data

(62) Division of application No. 12/358,471, filed on Jan. 23, 2009, now Pat. No. 8,652,589.
(Continued)

(51) Int. Cl.
*B65D 25/14* (2006.01)
*C23C 14/08* (2006.01)
(Continued)

(52) U.S. Cl.
CPC .............. *B65D 25/14* (2013.01); *B65D 25/34* (2013.01); *C23C 14/025* (2013.01); *C23C 14/08* (2013.01);
(Continued)

(58) Field of Classification Search
None
See application file for complete search history.

(56) References Cited

U.S. PATENT DOCUMENTS 3,833,321 A * 9/1974 Telang .................. B23P 15/00
                                                         418/178
4,314,880 A   2/1982 McGuire et al.
(Continued)

FOREIGN PATENT DOCUMENTS

FR   2836229 A1 *  8/2003
JP   2005218963 A * 8/2005
WO   2004057051 A1  7/2004

OTHER PUBLICATIONS

FR2836229A1_MT. Aug. 22, 2003.*
(Continued)

*Primary Examiner* — Humera N. Sheikh
*Assistant Examiner* — Elizabeth D Ivey
(74) *Attorney, Agent, or Firm* — Pearne & Gordon LLP

(57) ABSTRACT

A sealable volume has a wall forming at least a portion of a boundary limiting the volume. The wall includes a hydrogen permeation barrier including a layer system (LS) having at least one layer. The layer system includes at least one hydrogen barrier layer (HPBL) of an at least ternary oxide. Preferably, the oxide is substantially composed of Al, Cr and O and the hydrogen barrier layer (HPBL) is deposited using physical vapor deposition, in particular cathodic arc evaporation. Preferably, the layer system includes at least one of: an adhesion layer (AdhL), a hydrogen storage layer (HStL), a protective layer (ProtL), in particular a thermal barrier layer (ThBL), a diffusion barrier layer (DBL), an oxidation barrier layer (OxBL), a chemical barrier layer (ChBL), a wear resistance layer (WRL). Excellent hydrogen permeation barrier properties can be achieved, and the layer system can be tailored as required by an envisaged application.

13 Claims, 5 Drawing Sheets

Related U.S. Application Data

(60) Provisional application No. 61/023,455, filed on Jan. 25, 2008.

(51) Int. Cl.
| | |
|---|---|
| *H01M 8/04089* | (2016.01) |
| *F16C 33/04* | (2006.01) |
| *H01M 8/2475* | (2016.01) |
| *C23C 14/02* | (2006.01) |
| *F16C 33/14* | (2006.01) |
| *B65D 25/34* | (2006.01) |
| *G21B 1/11* | (2006.01) |

(52) U.S. Cl.
CPC ............ *F16C 33/043* (2013.01); *F16C 33/14* (2013.01); *G21B 1/11* (2013.01); *H01M 8/04089* (2013.01); *H01M 8/2475* (2013.01); *F16C 2223/60* (2013.01); *Y02E 60/32* (2013.01); *Y02P 70/50* (2015.11); *Y10T 428/13* (2015.01); *Y10T 428/2933* (2015.01); *Y10T 428/31678* (2015.04)

(56) References Cited

U.S. PATENT DOCUMENTS

| | | | | |
|---|---|---|---|---|
| 4,576,486 | A * | 3/1986 | Dils | G01J 5/08 |
| | | | | 250/339.04 |
| 4,738,905 | A * | 4/1988 | Collins | H01M 8/2485 |
| | | | | 429/460 |
| 5,192,578 | A | 3/1993 | Ramm | |
| 5,246,787 | A | 11/1993 | Schulz | |
| 5,741,372 | A | 4/1998 | Gugel | |
| 6,066,392 | A * | 5/2000 | Hisamoto | C25D 11/045 |
| | | | | 148/275 |
| 6,154,119 | A | 11/2000 | Jankowski | |
| 6,217,722 | B1 | 4/2001 | Jankowski | |
| 6,781,184 | B2 | 8/2004 | Solayappan | |
| 6,787,007 | B2 | 9/2004 | Lessing | |
| 6,900,095 | B2 | 5/2005 | Yoon | |
| 6,982,448 | B2 | 1/2006 | Udayakumar | |
| 6,984,857 | B2 | 1/2006 | Udayakumar | |
| 7,001,821 | B2 | 2/2006 | Aggarwal | |
| 7,857,948 | B2 | 12/2010 | Ramm | |
| 7,943,017 | B2 | 5/2011 | Ramm | |
| 8,129,040 | B2 | 3/2012 | Quinto | |
| 8,152,971 | B2 | 4/2012 | Quinto | |
| 2003/0062815 | A1 | 4/2003 | Kanao | |
| 2003/0102531 | A1 | 6/2003 | Joshi | |
| 2004/0142203 | A1 * | 7/2004 | Woolley | H01M 4/0428 |
| | | | | 428/615 |
| 2004/0168637 | A1 * | 9/2004 | Gorokhovsky | C23C 14/022 |
| | | | | 118/723 ER |
| 2006/0037660 | A1 | 2/2006 | Kinnally | |
| 2006/0118841 | A1 | 6/2006 | Eliason | |
| 2006/0191600 | A1 * | 8/2006 | Omura | C22C 38/40 |
| | | | | 148/287 |
| 2006/0257313 | A1 * | 11/2006 | Cisar | B01J 8/009 |
| | | | | 423/648.1 |
| 2007/0000772 | A1 | 1/2007 | Ramm | |
| 2007/0084244 | A1 * | 4/2007 | Rosenflanz | C03C 3/062 |
| | | | | 65/17.4 |
| 2007/0089764 | A1 | 4/2007 | Klassen et al. | |
| 2008/2220138 | A1 | 1/2008 | Ramm | |
| 2008/0193782 | A1 | 8/2008 | Ramm | |
| 2009/0269600 | A1 | 10/2009 | Ramm | |
| 2009/0269615 | A1 * | 10/2009 | Ramm | C22C 1/0416 |
| | | | | 428/697 |
| 2011/0183084 | A1 | 7/2011 | Ramm | |
| 2011/0278157 | A1 | 11/2011 | Rudigier | |
| 2012/0241907 | A1 | 9/2012 | Aggarwal | |
| 2013/0048490 | A1 | 2/2013 | Ramm | |
| 2015/0111795 | A1 * | 4/2015 | Rachbauer | C23C 14/08 |
| | | | | 508/107 |
| 2016/0031018 | A1 * | 2/2016 | Ota | B23C 5/10 |
| | | | | 407/53 |

OTHER PUBLICATIONS

FR 2836229A1_HT Aug. 22, 2003.*
Pulse enhanced electron emission (P3 e™) arc evaporation and the synthesis of wear resistant Al—Cr-0 coatings in corundum structure; Jurgen Ramm, Michael Ante, Theo Bachmann, Beno Widrig, Hans Brandie, Max Dobeli ; May 24, 2007 (Year: 2007) from IDS dated Jan. 6, 2014.*
"Hydrogen Cylinders and Transport Vessels"; European Industrial Gases Association; file:///H:/Applications/14s/14147743%20-%20Permeation%20Barrier%20Layer/Amendment%2012-30-2020/06-Hydrogen-Cylinders.PDF; 2003 (Year: 2003).*
Ramm et al., "Pulse enhanced electron emission (P3e™) arc evaporation and the synthesis of wear resistant Al—Cr—O coatings in a corundum structure". Surface & Coatings Technology, 202 (2007), pp. 876-833.
Derwent abstract (ACC-No. 2003-350929) of KR2003002033 by D.S. Yoon, published Jan. 8, 2003.
Learner at al., editors, Encyclopedia of Physics, second edition; excerpt article "Crystal Defects" by George Watkins, pp. 217-219; VCH publishers incorporated, New York; 1991.
Levchuk et al., "Al—Cr—O thin films as an efficient hydrogen barrier"; Surface & Coatings Technology 202 (2008), pp. 5043-5047.
Mattox, "Handbook of Physical Vapor Deposition (PVD) Processing", 2010, Second Edition, Elsevier, p. 287.

* cited by examiner

LS

| L3 | (HPBL, ProtL (ThBL, OxBL, ChBL, WRL, CRL,....) ...) |
| L2 | (HPBL, HyfL, HStL, WRL, CRL, ...) |
| L1 | (AdhL, HyfL, HPBL, HStL, ...) |
| SUB | |

PERMEATION BARRIER LAYER

FIELD OF THE INVENTION

The invention generally refers to the field of barrier layers, which are layers capable of reducing the permeability of a material for certain substances when such a layer is applied thereto. More particularly, the invention is related to hydrogen permeation barriers, which strongly reduce the hydrogen permeability of a substrate to which such a hydrogen permeation barrier is applied. Even more particularly, the invention relates to the storage and transport of hydrogen, in particular for applications in which energy is produced, converted, utilized or stored.

DEFINITION

The term "hydrogen" as used here comprises any of the three isotopes of hydrogen: $^1$H, $^2$D (deuterium) and $^3$T (tritium).

A "hydrogen barrier layer" or "hydrogen permeation barrier layer" is a layer which prevents or strongly impedes the transport of hydrogen through itself.

BACKGROUND OF THE INVENTION

Diffusion of hydrogen is a severe problem in all potential fields of application related to hydrogen production and utilization. Particularly demanding conditions exist in nuclear reactors, because of the high temperatures present, and since severe problems arise from the contact with liquid sodium or other corrosive material unavoidable for the operation of the reactor. High temperatures and corrosion resistance have also to be considered in combustion engines utilizing hydrogen. And chemical resistance (inertness) is necessary also in electrochemical processes associated with the production and storage of hydrogen.

In one known method for creating a hydrogen permeation barrier, hydrogen is bound in a hydride, as is discussed in DE 03130906. The hydrides are mainly based on hydride-forming rare earths (e.g., yttrium) or on alkaline earth metals such as calcium and magnesium. These materials form alloys with present container or wall materials.

Permeation of hydrogen through the walls of various components of nuclear reactors is a potential problem in reactor operation. In U.S. Pat. No. 4,314,880, the formation of intermetallic layers of the reactor material by dipping it into molten aluminum and heating up to 800° C. is suggested. The intermetallic compounds achieved by this method form a hydrogen barrier.

In US 2007/0089764, a gas-tight storage and transportation tank is described using also a metal hydride which differs for the different temperature ranges of the utilization.

In US 2007/0089764, furthermore, a thermoplastic polymer containing hydrides is disclosed as a diffusion barrier for hydrogen.

U.S. Pat. No. 6,787,007 discloses an electrochemically active hydrogen barrier consisting of a complete system of anode layer, cathode layer, electrolytic layer and a catalytic layer, activated by a voltage source.

WO 04057051 describes a hydrogen barrier obtained by puls plasma nitridation.

Furthermore, and more closely related to the present invention, the application of permeation barriers in the form of thin films, in particular of films based on ceramic oxides such as the α-phase of aluminium oxide (α-alumina, α-Al$_2$O$_3$), is suggested [1-4]. Such films have a high efficiency in suppressing hydrogen transport. These barriers can be used in many areas where hydrogen diffusion and retention in materials are of concern. Such films can be multi-functional, since they have the potential to serve also as anti-corrosion layers surviving thermal cycling, to withstand high heat and neutron fluxes and to allow the contact with aggressive media [5]. The highest potential to fulfil most of these requirements has α-alumina due to its unique high temperature thermal and mechanical properties.

PROBLEMS IN THE ART

All the solutions based on polymer and plastic diffusion barriers are limited to relatively low temperatures.

Approaches with metal hydrides show two inherent problems. The formation of the hydrides is usually coupled to the formation of an alloy between the substrate material and the hydride-forming material. In many cases, this has to be done at elevated temperatures (e.g., at in U.S. Pat. No. 4,314,880, at 800° C.), and doing so for large substrates is rather complicated, and furthermore, the freedom in the selection of the substrate material—in which the alloying should be done—is limited. The formation temperature of the hydrides can be influenced by the selection of the hydride-forming material. However, usually the lower formation temperature results in less temperature-stable hydrides.

Plasma-nitrided layers are an economically interesting approach for permeation barriers, but is has not been shown that this approach can be used for high temperature diffusion barriers in fusion reactors or combustion engines, and the permeation barrier behaviour of these layer is poor compared with the best known in state-of-the-art.

An electrochemically active diffusion barrier is an elegant but expensive solution. It is based on a relatively complicated layer design combined with electrical contacts and can not fullfil the demands for high temperature applications. And, if utilized in corrosive environment, additional protection is needed.

A very interesting and cost-effective way of creating a hydrogen barrier is based on the deposition of thin film layers on those components (substrates; usually made of metal or of ceramics) which are in contact with hydrogen. As discussed above, α-Al$_2$O$_3$, the corundum structure of alumina, is a very promising candidate due to its high temperature stability and outstanding mechanical properties. However, for the synthesis of α-Al$_2$O$_3$ in an industrial scale, either high deposition temperatures (of about 1000° C.) are required, or the process approaches have still to be upscaled for coating large and complex surfaces [6-9]. Recent results achieved with the deposition of alumina by PECVD [10] and magnetron sputtering [11] at temperatures below 600° C. and even 500° C., respectively, are promising. However, these laboratory studies are still far from application in industry.

OBJECTIVES OF THE INVENTION

Therefore, one object of the invention is to create an alternative to known hydrogen permeation barriers, in particular one that does not have the problems mentioned above or at least not many of these problems. Furthermore, an apparatus comprising a hydrogen permeation barrier shall be provided and a method for manufacturing a hydrogen permeation barrier. In addition, a use of a layer system shall be provided.

Another object of the invention is to provide a thin film hydrogen permeation barrier which has a hydrogen permeation barrier quality at least comparable to that of $\alpha$-$Al_2O_3$.

Another object of the invention is to provide a hydrogen permeation barrier having a formation temperature or deposition temperature or required substrate temperature of below 1000° C., preferably below 600° C., more preferably below 500° C. and even further preferred below 400° C.

Another object of the invention is to provide a hydrogen permeation barrier having a hardness comparable to the hardness of $\alpha$-$Al_2O_3$.

Another object of the invention is to provide a hydrogen permeation barrier which can be formed comprising one or more different phases, in particular phases from amorphous to corundum-type structures. Corundum-type structures show very promising hydrogen permeation barrier behavior. It is well known to a person skilled in the art of thin films and/or crystallography how to determined the presence or not-presence of a corundum-type structure.

Another object of the invention is to provide a hydrogen permeation barrier comprising at least one high temperature phase, i.e. at least one phase which is in thermal equilibrium only above 1000° C.

Another object of the invention is to provide a hydrogen permeation barrier the properties of which can be tailored in a rather uncomplicated way. In particular, wherein the hardness of the layer system can be tailored.

Another object of the invention is to provide a hydrogen permeation barrier which can be tailored for various applications, in particular multi-purpose applications, i.e. for applications requiring a combination of various different properties.

Another object of the invention is to provide a hydrogen permeation barrier which on the one hand is capable of largely impeding a loss of hydrogen and on the other hand is capable to store hydrogen.

Another object of the invention is to provide a hydrogen permeation barrier which can be produced on industrial scale, i.e. with good reproducibility and homogeneity (with respect to the properties over a surface coated with the hydrogen permeation barrier), at moderate efforts/moderate costs, and in large quantities, in particular a hydrogen permeation barrier which can be deposited in said manner over at least 100 $cm^2$, rather at least 1000 $cm^2$, or at least 5000 $cm^2$.

Another object of the invention is to form a combination of at least one hydrogen permeation barrier layer and at least one layer of a material capable of forming a hydride.

Another object of the invention is to provide a hydrogen permeation barrier which is particularly wear resistant.

Another object of the invention is to provide a hydrogen permeation barrier which is particularly heat resistant.

Another object of the invention is to provide a hydrogen permeation barrier which is particularly chemically inert.

Another object of the invention is to provide a way to provide substrates with a hydrogen permeation barrier which otherwise could not be provided with a hydrogen permeation barrier or at least not with a hydrogen permeation barrier of comparable properties.

Corresponding objects of the invention relate to corresponding apparatuses, methods and uses, respectively.

At least one of these objects is at least partially achieved by apparatuses, methods and uses according to the patent claims.

SUMMARY OF THE INVENTION

The method for manufacturing a hydrogen permeation barrier comprises the step of
a) depositing on a substrate a layer system comprising at least one layer;
and it is characterized in that step a) comprises the step of
b) depositing at least one hydrogen barrier layer comprising an at least ternary oxide.

Considered under a slightly different point of view, the method is a method for decreasing the hydrogen permeability of a substrate comprising the steps a) and b) mentioned above.

The apparatus comprises a sealable volume and a wall forming at least a portion of a boundary limiting said volume. Said wall comprises a hydrogen permeation barrier comprising a layer system comprising at least one layer. Said layer system comprises at least one hydrogen barrier layer comprising an at least ternary oxide.

Viewed from a particular point of view, the invention comprises a system comprising a first and a second volume and a hydrogen permeation barrier separating said first volume from said second volume. A hydrogen density in said first volume is different, in particular substantially different from a hydrogen density in said second volume. Said hydrogen permeation barrier comprises a layer system comprising at least one layer, and said layer system comprises at least one hydrogen barrier layer comprising an at least ternary oxide. Said system can be considered a hydrogen-comprising system.

The invention furthermore comprises a method for manufacturing an apparatus according to the invention, said method comprising the step of
B) depositing said hydrogen barrier layer on said wall.

The use according to the invention is a use of a layer system comprising at least one layer comprising an at least ternary oxide as a hydrogen permeation barrier, in particular as a hydrogen permeation barrier layer or coating.

Viewed from a slightly different angle, the use is a use of a layer system comprising at least one layer comprising an at least ternary oxide for decreasing, in particular substantially decreasing the hydrogen permeability of a substrate.

The hydrogen permeation barrier according to the invention comprises a layer system comprising at least one layer, wherein said layer system comprises at least one hydrogen barrier layer comprising an at least ternary oxide.

Through the invention, an alternative, in particular an improved hydrogen permeation barrier can be provided, as well as improved hydrogen permeation barrier manufacturing methods. The invention allows to provide many types of substrates with a hydrogen permeation barrier, in particular with a hydrogen permeation barrier of high quality and with excellent properties.

The hydrogen barrier layer is a layer which prevents or strongly impedes the transport of hydrogen through itself. Accordingly, when deposited on a substrate, the hydrogen barrier layer will, at least to a large extent, reduce the permeability of the substrate by hydrogen. Note that a substrate is still considered the substrate even after being complemented with a coating.

A substrate on which a hydrogen barrier layer is deposited can, e.g.,
itself be protected (to a large extent) from getting in contact with hydrogen (present on that side of the substrate on which the hydrogen barrier layer is deposited);

avoid (to a large extent) that hydrogen present in a volume enclosed (at least partially) by the substrate leaves said volume, i.e. protect the outside of said volume from the hydrogen present in said volume;

avoid (to a large extent) that hydrogen present outside a volume enclosed (at least partially) by the substrate enters said volume, i.e. protect the inside of said volume from the hydrogen present outside said volume.

An at least ternary oxide is a ternary oxide, i.e. an oxide comprising, besides O (oxygen), at least two more chemical elements, or a quaternary oxide, i.e. an oxide comprising, besides O (oxygen), at least three more chemical elements, or an oxide comprising, besides O (oxygen), four or more chemical elements.

In one embodiment, said at least one hydrogen barrier layer is composed of said at least ternary oxide to a degree of at least 50 at %, more particularly to a degree of at least 70 at %, more particularly to a degree of at least 80 at %.

In one embodiment, said at least one hydrogen barrier layer is substantially composed of said at least ternary oxide, in particular, said at least one hydrogen barrier layer is composed of said at least ternary oxide to a degree of at least 90 at %, more particularly to a degree of at least 95 at %.

In one embodiment which may be combined with one or more of the before-addressed embodiments, the hydrogen permeation barrier substantially consists of said layer system.

In one embodiment which may be combined with one or more of the before-addressed embodiments, the hydrogen permeation barrier has a thickness of at least 5 nm, in particular of at least 10 nm, or of at least 1 µm.

In one embodiment which may be combined with one or more of the before-addressed embodiments, the hydrogen permeation barrier has a thickness of at most 50 µm, in particular of at most 10 µm, or of at most 1 µm.

In one embodiment which may be combined with one or more of the before-addressed embodiments, said at least ternary oxide comprises at least one metallic chemical element. Therein, metallic includes metals, semimetals and transition metals.

In one embodiment which may be combined with one or more of the before-addressed embodiments, said at least ternary oxide is a ternary oxide.

In one embodiment which may be combined with one or more of the before-addressed embodiments except the last-mentioned one, said at least ternary oxide is a quarternary oxide.

In one embodiment which may be combined with one or more of the before-addressed embodiments, said at least ternary oxide substantially has a corundum-type structure.

In one embodiment which may be combined with one or more of the before-addressed embodiments, said at least ternary oxide comprises a solid solution or is substantially a solid solution. A solid solution is a solid-state solution of one or more solutes in a solvent, wherein, upon addition of the solute or solutes to the solvent, the crystal structure of the solvent remains unchanged (wherein the crystal lattice may become distorted), and wherein the mixture remains at least substantially in a single homogeneous phase.

In one embodiment which may be combined with one or more of the before-addressed embodiments, said at least ternary oxide comprises aluminium.

In one embodiment which may be combined with one or more of the before-addressed embodiments, said at least ternary oxide comprises chromium.

In one embodiment which may be combined with one or more of the before-addressed embodiments, said at least ternary oxide is substantially composed of Al, Cr and O, in particular with 16 to 34 at % Al, 6 to 24 at % Cr and 50 to 70 at % O.

In one embodiment which may be combined with one or more of the before-addressed embodiments with the exception of the three last-mentioned ones, said at least ternary oxide is substantially composed of Al and O and at least one of the group consisting of Au (in particular 20 to 30 at %)
B (in particular less than 3 at %)
Be (in particular 20 to 30 at %)
C (in particular less than 3 at %)
Cr (in particular more than 10 or more than 25 at %)
Fe (in particular 2 to 15 at %)
Hf (in particular 5 to 10 at %)
Ir (in particular 10 to 15 at %)
La (in particular 10 to 15 at %)
Mo (in particular 2 to 5 at %)
Nb (in particular 1 to 3 at %)
Ta (in particular 1 to 3 at %)
Ti (in particular 2 to 6 at %)
V (in particular 3 to 8 at %)
W (in particular 5 to 8 at %)
Y (in particular 12 to 16 at %)
Zr (in particular 2 to 4 at %);

or wherein said at least ternary oxide is substantially composed of

Fe, Va and O;
Fe, Cr and O; or
Va and Cr and O.

In one embodiment which may be combined with one or more of the before-addressed embodiments, said at least ternary oxide is slightly under-stoichiometric with respect to oxygen, in particular by up to 20%, more particularly by up to 5% of the stoichiometric oxygen content.

In one embodiment of the method, which may be combined with one or more of the before-addressed embodiments, step b) is carried out at a substrate temperature of below 800° C., in particular below 600° C., more particularly below 500° C. This allows to provide substrates with a hydrogen permeation barrier which may not be heated above 600° C., as would be required for some other, known hydrogen permeation barriers.

In one embodiment of the method, which may be combined with one or more of the before-addressed embodiments, said depositing said at least one hydrogen barrier layer is carried out using a physical vapor deposition method.

In one embodiment of the method, which may be combined with one or more of the before-addressed embodiments, said depositing said at least one hydrogen barrier layer is carried out using a cathodic arc evaporation method, in particular an unfiltered cathodic arc evaporation method.

In one embodiment which may be combined with one or more of the before-addressed embodiments, at least two layers of said layer system are deposited without moving said substrate out of a vacuum treatment chamber between depositing a first of said two layers and depositing the second of said two layers. This strongly simplifies and accelerates the creation of the hydrogen permeation barrier.

In one embodiment of the method, which may be combined with one or more of the before-addressed embodiments, step a) is carried out within a vacuum treatment chamber without moving said substrate out of said vacuum treatment chamber. This strongly simplifies and accelerates the creation of the hydrogen permeation barrier.

In one embodiment of the method, which may be combined with one or more of the before-addressed embodiments, step a) comprises, before step b), the step of c) depositing on said substrate an adhesion layer for increasing an adhesion of said at least one hydrogen barrier layer on said substrate.

In particular, said adhesion layer is deposited before depositing another layer, i.e. directly onto the "naked" substrate.

In one embodiment which may be combined with one or more of the before-addressed embodiments, an adhesion layer is deposited, and said adhesion layer comprises at least one of the group consisting of
- a metal;
- a hydride-forming metal;
- an alloy;
- an alloy comprising at least one hydride-forming metal;
- a nitride;
- a metal nitride;
- in particular a combination of a metal and a metal nitride.

Apparently, hydride-forming metals or alloys can enhance the hydrogen permeation barrier behavior, thus, a double positive effect can be achieved.

In one embodiment which may be combined with one or more of the before-addressed embodiments, an adhesion layer is deposited, and said depositing said adhesion layer is carried out using a physical vapor deposition method.

In one embodiment which may be combined with one or more of the before-addressed embodiments, an adhesion layer is deposited, and said depositing said adhesion layer is carried out using a cathodic arc evaporation method.

In one embodiment which may be combined with one or more of the before-addressed embodiments, an adhesion layer is deposited, and said depositing said adhesion layer is carried out using the same type of method as used for depositing said hydrogen barrier layer. This simplifies the deposition process.

In one embodiment which may be combined with one or more of the before-addressed embodiments, an adhesion layer is deposited, and said adhesion layer comprises at least one chemical element which is also comprised in said substrate and/or also comprised in said hydrogen barrier layer. This can enhance the adhesion of the hydrogen permeation barrier to the underlying substrate.

In one embodiment of the method, which may be combined with one or more of the before-addressed embodiments, step a) comprises the step of e) depositing on said substrate a hydrogen storage layer capable of storing and releasing hydrogen.

In particular, said hydrogen storage layer comprises or substantially consists of a material capable of forming a hydride.

In one embodiment of the method, which may be combined with one or more of the before-addressed embodiments, step a) comprises the step of d) depositing on said substrate a protective layer for protecting at least one layer of said layer system, in particular all other layers of said layer system or one or more layers of said layer system arranged between said substrate and said protective layer, from external influences.

Note that said external influences can be influences from anywhere outside the addressed protected layer. It will in many cases be influences from outside the layer system, in particular from outside the coated substrate, more preferably from the coated side of the substrate, but it can also be influences from another layer of the layer system or from the substrate. In many cases, said protective layer forms the outermost layer of the layer system (farest away from the substrate).

In one embodiment of the before-mentioned embodiment, the said protective layer is at least one of the group consisting of
- a thermal barrier layer for protecting said at least one layer to be protected from thermal influences, said thermal barrier layer having a thermal conductivity smaller, in particular substantially smaller or smaller by a factor of at least 1.3 or of at least 2, than a thermal conductivity of at least one other layer of said layer system;
- a diffusion barrier layer for reducing a transport of material within, into or out of said layer system, said diffusion barrier layer providing a stronger impediment, in particular substantially stronger or stronger by a factor of at least 1.3 or of at least 2, to transport of material across itself than at least one other layer of layer system;
- an oxidation barrier layer for protecting said at least one layer to be protected from oxygen, said oxidation barrier layer providing a stronger impediment, in particular substantially stronger or stronger by a factor of at least 1.3 or of at least 2, to transport of oxygen across itself than at least one other layer of said layer system;
- a chemical barrier layer for protecting said at least one layer to be protected from chemically reacting, said chemical barrier layer having a chemical inertness—with respect to at least one reactive substance—higher than a chemical inertness of at least one other layer of said layer system;
- a wear resistance layer for increasing a wear resistance of said at least one layer to be protected, said wear resistance layer having a higher wear resistance, in particular a substantially higher wear resistance or a wear resistance higher by a factor of at least 1.3 or of at least 2, than at least one other layer of said layer system;

Said thermal barrier layer reduces, in particularly strongly reduces the heat transfer across itself.

Said diffusion barrier layer prevents or reduces, in particularly strongly reduces transport of material across itself.

Said oxidation barrier layer prevents or reduces, in particularly strongly reduces the transport of oxygen across itself, thus protecting material underneath itself from oxidation (at least from its side).

Said chemical barrier layer prevents or reduces, in particular strongly reduces chemical reactions of material (in particular from the environment) in front of this layer with material (such as at least one layer of the layer system) underneath this layer.

Said wear resistance layer prevents or reduces, in particular strongly reduces mechanical wear and/or degradation of the layer system.

In one embodiment, which may be combined with one or more of the before-addressed embodiments, said substrate comprises or substantially is at least one of the group consisting of
- a metal;
- an alloy;
- ceramics.

In one embodiment of the method, which may be combined with one or more of the before-addressed embodiments, the method comprises the step of forming a boundary between a first and a second volume by means of said hydrogen permeation barrier, wherein a hydrogen density in said first volume is different from a hydrogen density in said second volume.

In one embodiment which may be combined with one or more of the before-addressed embodiments, the apparatus is or comprises at least one of the group consisting of
a hydrogen storage container;
a hydrogen transport container;
a fusion reactor;
a fuel cell;
a battery;
a combustion engine;
a superconducting electricity-grid;
an electric transmission cable;
a fuel tank.

With respect to the application of hydrogen permeation barriers in superconducting electricity-grids and electric transmission cables, it is to be noted that hydrogen and/or specific hydrogen compounds (in particular compounds with Si; specific silanes) have shown potential to be low-resistance or superconducting conductors, at sufficiently low temperatures and sufficiently high pressures. See, e.g., the article "Superconductivity in Hydrogen Dominant Materials: Silane" of M. I. Eremets, I. A. Trojan, S. A. Medvedev, J. S. Tse, Y. Yao. In corresponding hydrogen-containing conductors, the escape of hydrogen can be reduced or avoided by means of hydrogen permeation barriers according to the invention, and the hydrogen density in such a conductor can be increased.

The invention comprises apparatuses and uses with features of corresponding methods according to the invention, and vice versa. The advantages of the apparatuses and uses correspond to the advantages of corresponding methods and vice versa.

Further embodiments and advantages emerge from the dependent claims and the figures.

BRIEF DESCRIPTION OF THE DRAWINGS

Below, the invention is described in more detail by means of examples and the included drawings. The figures show:

FIG. 1a);

FIG. 1b).

Figure 1A:
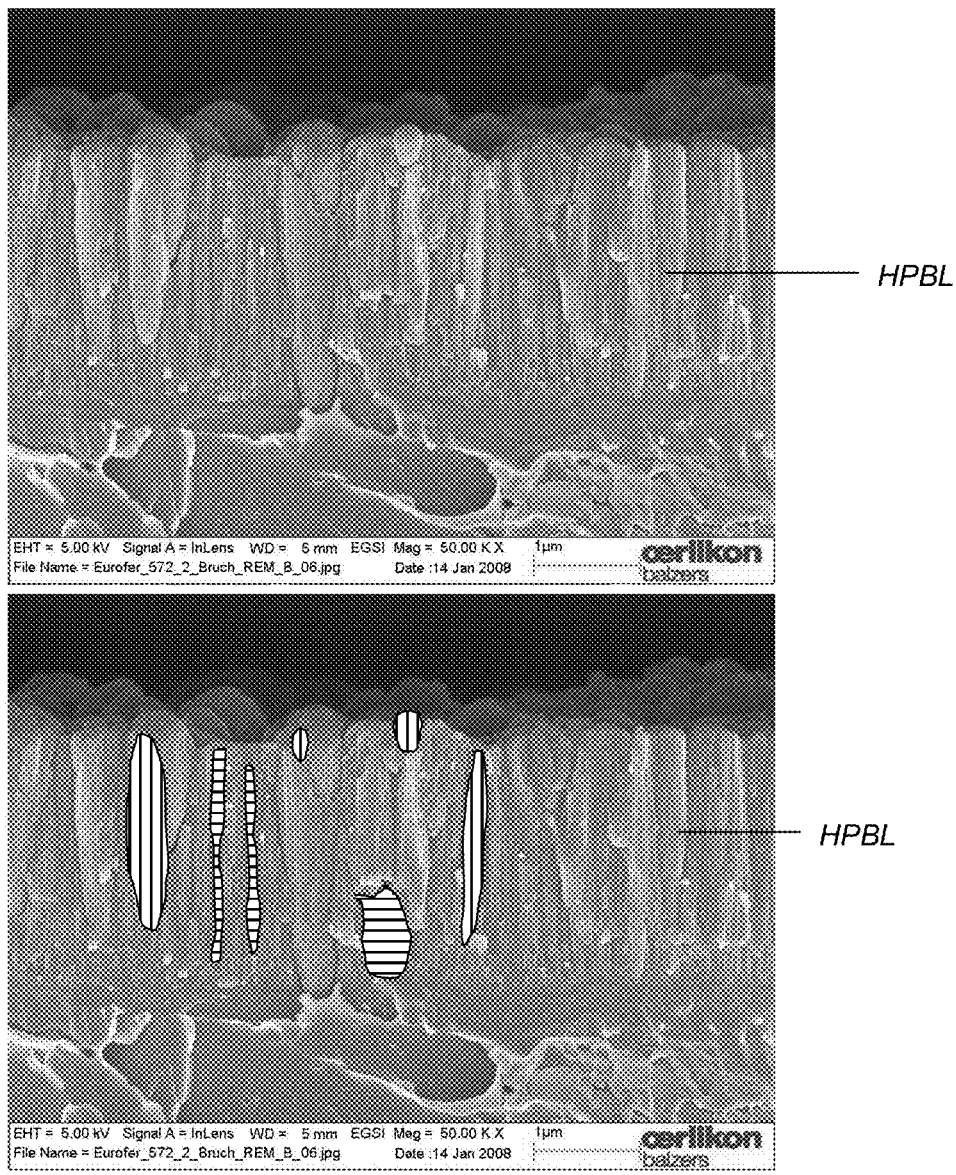
FIG. 1a a cross-sectional scanning electron microscopy micrograph showing the coating morphology for an Al—Cr—O layer deposited with 1000 sccm oxygen; in the lower part of FIG. 1a, the scanning electron microscopy micrograph is reproduced with vertikal hatching where droplets are present and with horizontal hatching where columnar structures are present.

The reference symbols used in the figures and their meaning are summarized in the list of reference symbols. The described embodiments are meant as examples and shall not confine the invention.

DETAILED DESCRIPTION OF THE INVENTION

Below, a hydrogen permeation barrier will be presented which comprises, or more particularly is, a layer system (a single layer or a layer stack of at least two layers) deposited by physical vapor deposition (PVD), more particularly by cathodic arc evaporation, on a substrate made of steel. The layer system comprises an Al—Cr—O layer, i.e. a layer consisting of the chemical elements Al, Cr and O, which was deposited on the steel substrate utilizing an adhesion layer (interface) consisting of two sublayers: one of metallic Cr and one of a metallic Al/Cr alloy. The choice of the substrate material, however, is not limited to steel; many other materials can be used for the substrate, such as metals, alloys, ceramics and others. Surprisingly, this layer stack is an outstanding permeation barrier for hydrogen, i.e. it strongly inhibits the permeability of the coated substrate with respect to hydrogen. And moreover, it combines this property with an excellent oxidation barrier behaviour, i.e. it prevents oxidation of the underlying substrate.

It is known from the literature [11] that Al—Cr—O may form corundum-type structures and that these structures are quite stable at high temperatures. However, the morphology of the arc evaporated layers usually shows droplets of different sizes distributed in the layer, and it was completely unexpected that it is possible to form, by means of cathodic arc evaporation, such an efficient hydrogen permeation barrier as the Al—Cr—O layer turned out to be. This was unexpected also for the reason that one major effort in the synthesization of $\alpha$-$Al_2O_3$ is the search for droplet-free deposition methods, which is reflected, e.g., in the utilization of filtered arc evaporation in order to achieve smooth and droplet-free coatings [9].

Surprisingly, the layer system was also temperature-stable up to at least 800° C. (which simply was the highest temperature available in the experiment), both for a clearly corundum-type structure of the Al—Cr—O layer as well as for the XRD-amorphous structure of the Al—Cr—O layer. Accordingly, it has to be assumed that also for the coexistence of several phases of the Al—Cr—O material, the surprisingly great hydrogen permeation barrier behaviour exists.

In the following, a short description of the deposition process and the sample preparation will be given. A more detailed description of the arc evaporation process can be found in reference [12]. Therefore, reference [12] is hereby incorporated by reference in this patent application.

The deposition of the Al—Cr—O layers (films) was performed in an OC Oerlikon Balzers Innova system that combines typical production capabilities for standard PVD nitride coatings and additional new features for oxide layer deposition. The oxide layers were synthesized by a new approach of cathodic arc evaporation named Pulse Enhanced Electron Emission (P3e™). This approach allows continuous operation of the cathodic arc sources in a pure oxygen environment [12].

Before loading into the deposition system, the samples were wet-chemically cleaned. The sample material was a so-called reduced activation ferritic martensitic steel EUROFER97 developed for fusion applications. This steel contains 9 at % of Cr and is expected to be utilized as a structural material in future fusion reactors [13].

After evacuation of the system (deposition chamber), a standard heating-etching pre-treatment was performed, and a substrate temperature of 550° C. was established. After this, an interface consisting of Cr—Al/Cr with a total thickness of about 200 nm was deposited (firstly 100 nm of Cr, then 100 nm of Cr and Al). Therein, an arc current of 140 A was used for the Cr arc source, followed by the operation of the Al/Cr alloy target with an arc current of 200 A. The selection of this interface had initially no other motivation but to achieve a reasonable adhesion of the Al—Cr—O layer to the substrate and to utilize the same targets for interface (adhesion layer) and Al—Cr—O layer (hydrogen barrier layer). However, it is believed and, in addition, demonstrated here, that in particular metallic layers of hydride-forming metals and/or alloys comprising or consisting of hydride-forming metals may support the permeation barrier properties of the whole layer system. Solely for the reason of achieving a good adhesion, many other materials, such as nitrides or oxides, could have been used as well (as adhesion layer); such nitride or oxide layers are known from PVD technology.

An abrupt transition between the adhesion layer (Cr—Al/Cr) and the oxide (Al—Cr—O) was achieved by initiating the oxygen gas flow. In contrast to the deposition of the metallic adhesion layers, the Al—Cr—O layers were deposited in pure oxygen gas and without argon. For the Al/Cr source, an arc current of 200 A was used during the deposition of the Al—Cr—O hydrogen barrier layer. Oxygen flows of 300 sccm and 1000 sccm, respectively, were chosen for the Al—Cr—O layers in this experiment. Alloyed aluminium-chromium targets with a nominal composition of 70 at % Al and 30 at % Cr were utilized for the arc evaporation. However, other alloy compositions can be chosen as well which will be reflected in the metal composition of the layer in about the same composition like in the targets. Bothe, the Al and the Cr content may amount to anything between 1 and 99 at %, more particularly between 5 and 95 at % or between 10 and 90 at % or even between 15 and 85 at %.

Just for comparison reasons, at least one sample underwent additional oxygen plasma treatment after deposition to check if this treatment would improve the barrier behaviour.

The coatings with oxygen flows of 300 sccm and 1000 sccm, respectively, were characterized by different analysis methods:

The layer morphology and microstructure of the coatings were investigated by a LEO 1530 scanning electron microscopy (SEM). Cross-section SEM micrographs (X-SEM) were taken from the layers deposited on the EUROFER97 substrates. Because of the high degree of flexibility of the EUROFER97 substrates at room temperature, the samples had to be cooled down to liquid nitrogen temperature in order to allow breaking.

The composition of the as-produced layers was analysed by Rutherford Backscattering Spectrometry (RBS). The measurements were performed using a 2 MeV $^4$He beam and a silicon surface barrier detector under 165°. The collected data were evaluated using a program known as the RUMP program [14].

The room temperature layer hardness was determined by Martens hardness measurements (Fisherscope H100c) following the ISO14577-1 guidelines [15]. In addition to the measured indentation hardness (HIT), the specific universal plastic hardness (HUp1) was measured, too, and converted into plastic Vickers hardness (HVp1).

The crystallinity of the synthesized coatings was investigated by X-ray diffraction (XRD). The measurements were performed on a Bruker-AXS D8 diffractometer with Gobel-Mirror and energy-dispersive detector using Cu K$\alpha$-radiation in $\theta$-$2\theta$-mode.

Hydrogen permeation tests were performed utilizing a typical experimental set-up for testing samples for fusion applications. However, it should be mentioned that this investigation does not pose any limitation with respect to the fields of application of the addressed hydrogen permeation barriers, and the application of the addressed hydrogen permeation barriers is not even limited to the applications mentioned in the present patent application.

A thin, round sample of 20 mm in diameter, sealed with two gold O-rings, divides the measuring chamber into two parts: the upstream and the downstream volume. The sample can be heated up to 800° C. by means of an electric furnace. The working gas is deuterium which is introduced into the upstream volume through a liquid nitrogen trap so as to reduce water contamination. The pressure in this volume is controlled using pressure gauges. Registration of the permeated deuterium is carried out using a quadrupole mass-spectrometer when the downstream volume is continuously pumped. During experiments, the deuterium pressure in the upstream part is increased in a stepwise manner. The next portion is added when a steady-state level of the permeation rate has been achieved. After each experimental run, the sample is annealed to release deuterium accumulated in the bulk. The samples (coated on one side) are installed so that the coating is directed towards the applied deuterium pressure.

Because of the unexpected high efficiency of layers as a hydrogen permeation barrier and because of the resulting long experimental runs with the tested samples, the working temperature range has been limited to a narrow window of 600 to 700° C. Lower temperatures would have resulted in fluxes of permeated hydrogen so low that it would have been insufficient for detection, and at 800° C., the duration of the experiments was still so long that the test reached the limit of the temperature capability of the experimental set-up.

In the following, the layer analysis and the results of the hydrogen permeation experiments are discussed:

The morphology of the layers is commonly expected to play an decisive role if a utilisation as a diffusion barrier, in particular as a hydrogen permeation barrier is envisaged. In thin layers of a few micrometers in thickness, columnar growth and droplets may drastically reduce the barrier efficiency. This is particularly important for a layer formation utilising cathodic arc evaporation, because it is well known that in this deposition technique, the formation of droplets is more likely to occur than in sputtering or conventional thermal evaporation. This is also the reason why for critical state-of the-art applications for which the high degree of ionization in arc evaporation is desirable but the droplets generation has to be avoided, filtered arc deposition is chosen [16,17].

In all experiments discussed here, however, the layers were produced without such a filter. In other words, the deposition conditions were not optimized for droplet reduction. More emphasis was given to utilize a process with the capability for large scale deposition and to test the as-obtained layers for their suitability to act as permeation barriers despite the droplet formation. All the SEM cross section micrographs (FIGS. 1a and 1b) therefore show the well-known droplets typical for unfiltered cathodic arc evaporation processes.

Figure 1B:
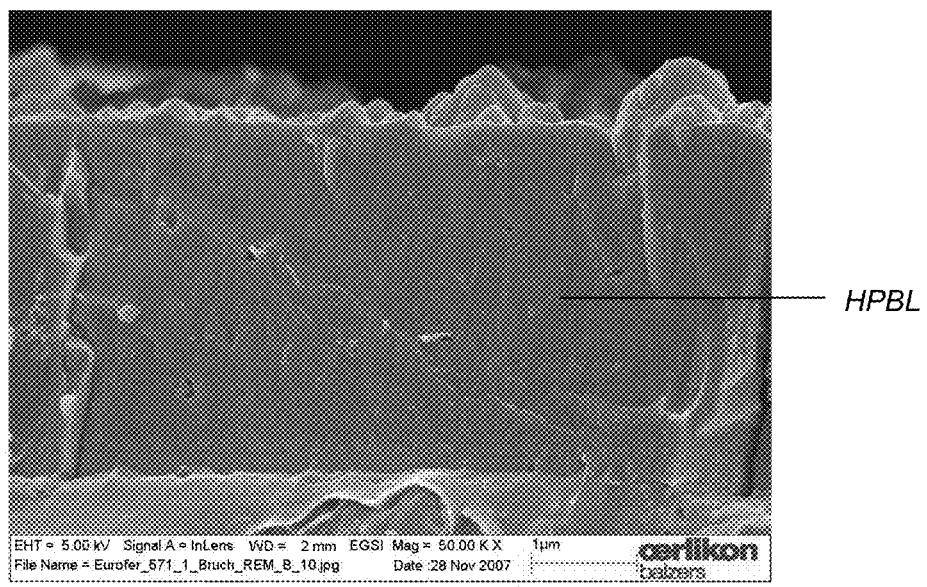
FIG. 1b a cross-sectional scanning electron microscopy micrograph showing the coating morphology for an Al—Cr—O layer deposited with 300 sccm oxygen flow.

The X-SEM micrograph shown in FIGS. 1a and 1b allow a comparison of the coating morphology for an Al—Cr—O layer (depicted as HPBL for "hydrogen permeation barrier layer") deposited with 1000 sccm oxygen (FIG. 1a) and at 300 sccm oxygen flow (FIG. 1b), respectively. All the other process conditions were kept identical for these samples. Both layers show droplets on the X-SEM. However, the layer morphology is quite different. In the lower part of FIG. 1a, the X-SEM is reproduced with vertikal hatching where droplets are present and with horizontal hatching where columnar structures are present. A significant difference in the morphology can be seen. The higher oxygen flow (of 1000 sccm; FIG. 1a) results in a rather columnar growth (horizontal hatching) with pronounced grain boundaries, and a number of droplets (vertikal hatching) spread over the whole layer. In FIG. 1b (lower oxygen flow of 300 sccm) the grain boundaries in the layer are suppressed and a densification of the layer is visible. The lower oxygen flow (FIG. 1b) shows a strong tendency to "densify" the morphology, and the columnar growth is reduced, and there are less droplets visible in the cross-section.

Additional layers were deposited with a reduced Al—Cr—O layer thickness of only 1 µm which showed improved morphology for 300 sccm as well as for 1000 sccm oxygen flows, and finally, the oxide thickness was reduced to 100 nm only. For all these layers, exceptionally good hydrogen permeation barrier behaviour was measured. Therefore, it was concluded that the Al—Cr—O layer thickness is not essential for the hydrogen permeation barrier behaviour. Accordingly, the Al—Cr—O layer thickness may rather be adjusted for optimizing/adjusting additional properties such as oxidation resistance, corrosion resistance and/or mechanical and/or electrical and or optical properties.

Figure 2A:
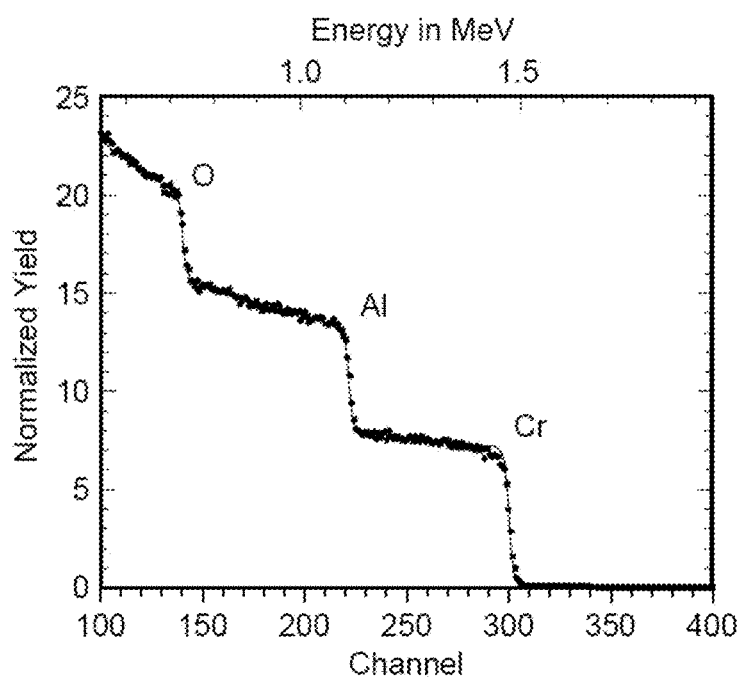
FIG. 2a an RBS (Rutherford Backscattering Spectrometry) spectrum of the sample deposited with an oxygen flow of 1000 sccm (cf.
Figure 2B:
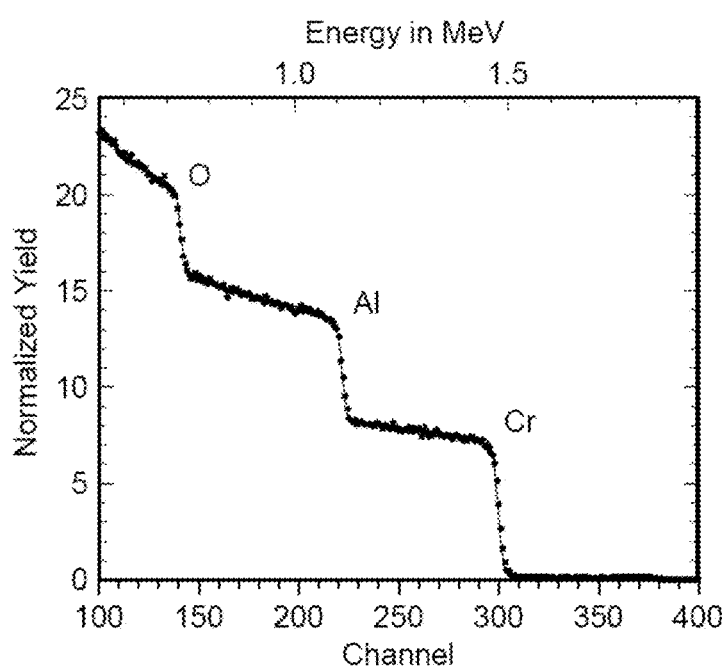
FIG. 2b an RBS (Rutherford Backscattering Spectrometry) spectrum of the sample deposited with an oxygen flow of 300 sccm (cf.

In FIGS. 2a and 2b, RBS (Rutherford Backscattering Spectrometry) spectra of the samples with 1000 sccm (FIG. 2a) and 300 sccm (FIG. 2b), respectively, are shown. The measurement suggests a composition of $Al_{1.42}Cr_{0.58}O_{2.95}$ (FIG. 2a) and of $Al_{1.42}Cr_{0.58}O_{2.90}$ (FIG. 2b), respectively, which is in fair agreement with the ratio of the metals in the utilised alloy targets (70% Al and 30% Cr). The slight deficiency in the oxygen content (2.90 and 2.95, respectively, instead of 3) might be at least partially attributed to the existence of metallic droplets in the layer. Within the measurement errors, there is no significant difference in the oxygen content of the layers of FIGS. 2a and 2b, respectively. The above-mentioned additional oxygen plasma post-treatment which was performed at at least one sample did neither result in a modification of the RBS spectrum (i.e. in no change of the composition) nor in a modification of the behaviour as permeation barrier.

High temperature stability of the hydrogen permeation barrier coating is required particularly for fusion-related applications. This is also the reason why there is so much interest in corundum ($\alpha$-$Al_2O_3$) as a barrier coating.

The capability of the here utilized P3e™ technology to synthesize solid solutions of corundum-type structures at PVD-typical substrate temperatures of 550° C., i.e. far off the thermal equilibrium for that structure (above 1000° C.), was investigated elsewhere [11,12].

Figure 3A:
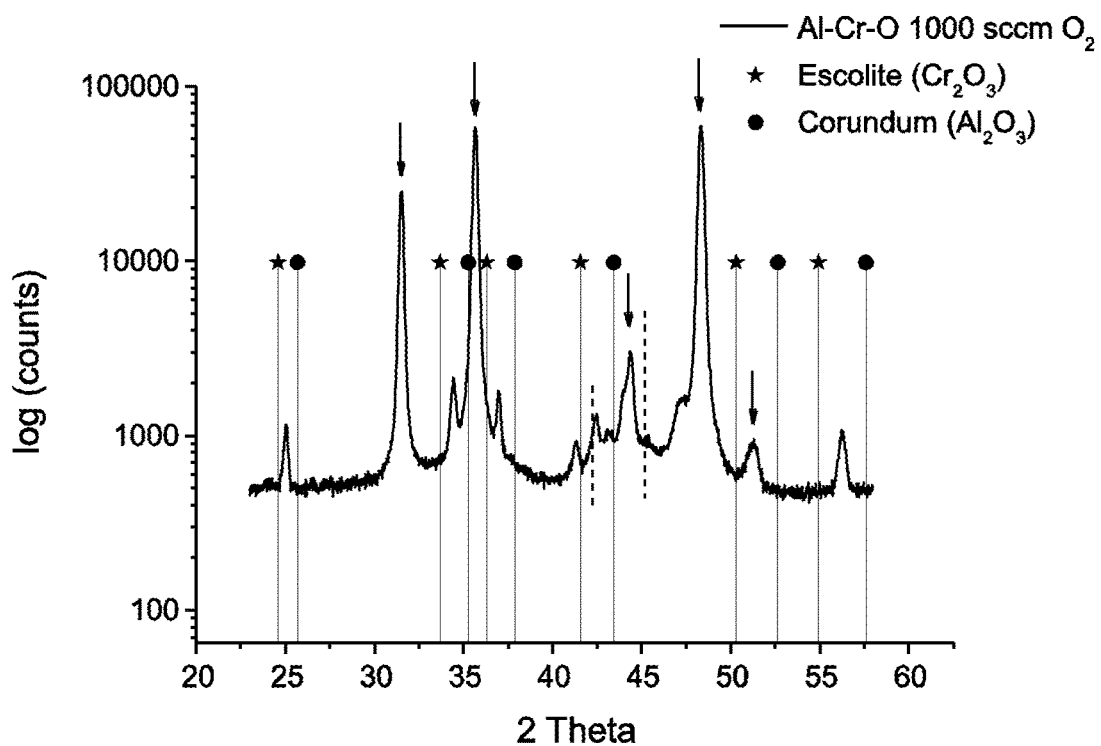
FIG. 3a an XRD (X-ray diffraction) measurement for a sample deposited with an oxygen flow of 1000 sccm.
Figure 3B:
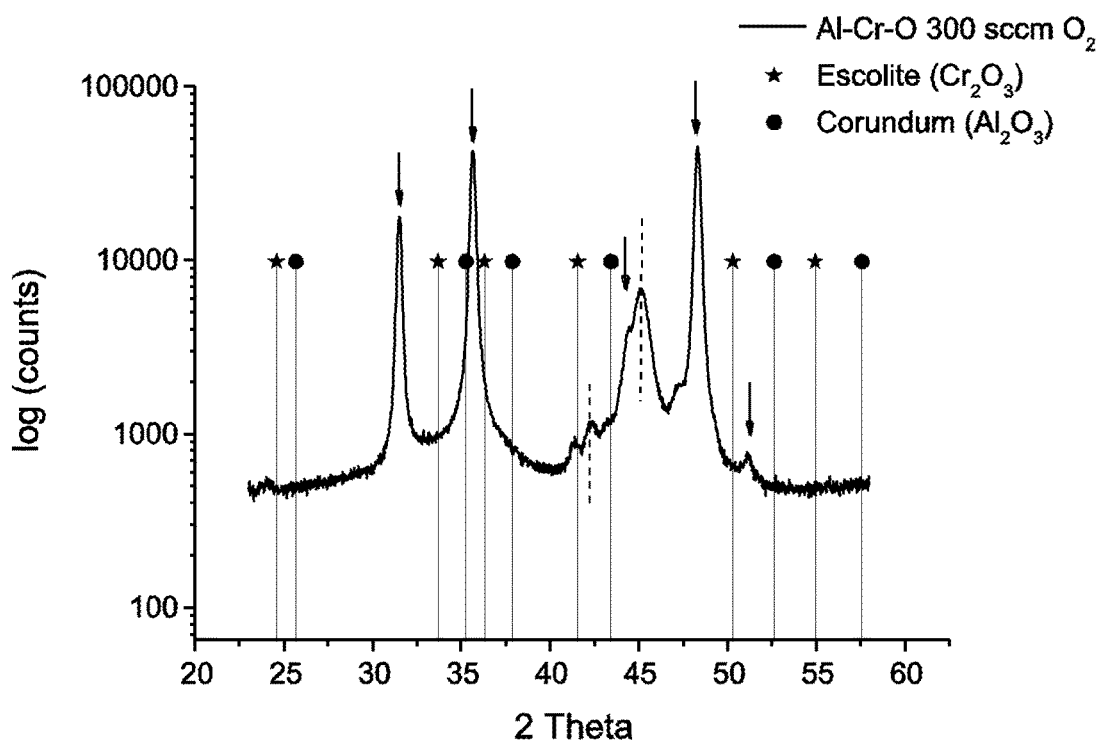
FIG. 3b an XRD (X-ray diffraction) measurement for a sample deposited with an oxygen flow of 300 sccm.

In FIGS. 3a and 3b, respectively, XRD (X-ray diffraction) measurements are presented which were performed at samples deposited with an oxygen flow of 1000 sccm (FIG. 3a) and with an oxygen flow of 300 sccm (FIG. 3b), respectively. For these measurements, cemented carbide substrates were coated in the same batches and with the same layer (metallic adhesion layer of about 100 nm Cr and about 100 nm AlCr, followed by the Al—Cr—O layer of about 3 µm thickness) as described above.

Corundum-type growth of the solid solution was assumed if at least five Bragg peaks of the solid solution layer were positioned between the escolaite chromia peak (2-Theta position marked with a star) and the corundum alumina peak (2-Theta position marked with a dot). The XRD pattern of the sample deposited using 1000 sccm oxygen flow (FIG. 3a) can be compared to the pattern of sample deposited using 300 sccm oxygen flow (FIG. 3b). The lines marked with arrows are Bragg peaks originating from the substrate. For the sample with 1000 sccm oxygen flow (FIG. 3a), the peak positions are between escolaite (PDF No. 38-1479 of the ICDD data base) and $\alpha$-alumina (PDF-No. 46-1212 of the ICDD data base) which is an indication for the corundum-type structure of the coating. The sample coated using 300 sccm oxygen does not show the Bragg peaks at positions which indicate corundum structure. But this might be due to the smaller crystallite size which may not be resolved by XRD, and which is indicated already by the denser morphology of the layer. However, two additional peaks appear more clearly in the spectrum (marked with dashed lines) which could be an indication of other phases in the layer.

The layer hardness HVp1 of the samples was measured and found to be in the range of 2000 to 2400 which is similar to the hardness of $\alpha$-$Al_2O_3$ and matches well the values given in [12] for the corundum-type solid solutions.

The permeation measurements of the coated samples have shown a permeation reduction factor (PRF; the ratio of permeabilities through uncoated and through coated samples) in the range of 2000 to 4000 which is a remarkable improvement compared to best values in the literature [4] for corund and for erbium oxide. Moreover, the deposition technology proposed in the present patent application is—in contrast to state-of-the-art deposition technology (which is utilized in the literature for the deposition of $\alpha$-$Al_2O_3$)—a production technology for coating large substrates at moderate temperatures. Furthermore, Al—Cr—O films deposited on the before-addressed adhesion layers and also such which were applied directly to a "naked" substrate showed very good adhesion to steel and other metallic substrates, and no delamination occurred if substrates were bended. The high layer hardness results, in addition, in an improvement of the wear properties of the coated substrate surfaces. The versatility of the PVD deposition technology allows the formation of multi-functional layer systems (layer stacks) which combine different material properties in one coating consisiting of a number of different layers, but deposited in one single deposition process, i.e. without having to move the sample out of the deposition chamber during the deposition of the layer system.

Figures 4, 5:
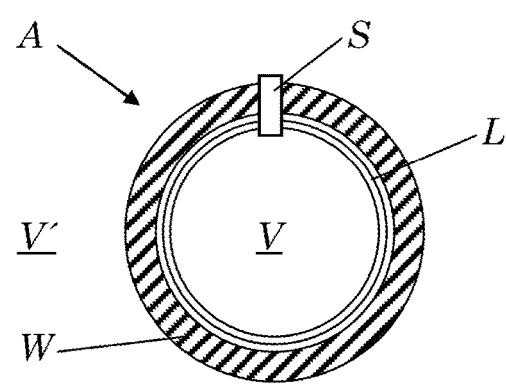
FIG. 4 a coating architecture of a hydrogen permeation barrier realizing a multi-functional layer system, schematically.
FIG. 5 an apparatus comprising a sealable volume and a hydrogen permeation barrier in form of a layer system, schematically.

The invention is further explained referring to FIG. 4. FIG. 4 shows an example of a coating architecture (layer sequence) of a layer system LS representing a hydrogen permeation barrier. The layer combination offers various possibilities for realizing a multi-functional coating stack. Due to the assignment of different possible types of layers indicated in FIG. 4, many different layer combinations are possible. Only some of these will now be discussed more closely. It will usually depend on the desired application, which layer system will be realized.

The layer L1, first deposited on the substrate SUB, is usually an adhesion layer AdhL arranged between the substrate or component SUB and a hydrogen permeation barrier layer HPBL. This adhesion layer AdhL ensures a good adhesion of the hydrogen permeation barrier layer HPBL to the substrate SUB, e.g., by adjusting the different coefficients of thermal expansion between substrate SUB and the HPBL. Accordingly, the adhesion layer AdhL can be considered a gradient layer; wherein it is furthermore possible that the composition of the adhesion layer AdhL changes gradually (more or less smoothly, or in finer or larger steps) perpendicularly to the substrate surface; this gives the term "gradient layer" another meaning. The before-described adhesion layer of two sublayers Cr—Al/Al can be considered to show such a gradual change. Or, e.g., the adhesion layer AdhL is a material of high toughness and thereby ensures a good adhesion of the hydrogen permeation barrier layer HPBL to the substrate SUB.

The adhesion layer AdhL can be a nitride layer like well-known in the state-of-the-art PVD deposition. Especially preferred as material for an adhesion layer AdhL is a metal or metal alloy which consists of or comprises at least one hydride-forming metal or a metal or metal alloy which is doped with hydride-forming metals like it is described in more detail in this invention for Cr—Al/Cr. This layer will support the hydrogen permeation barrier behavior of the hydrogen permeation barrier layer HPBL which is usually deposited as the second layer L2 on top of the adhesion layer L1. The third layer L3 can have protection functionality (protective layer ProtL). It can, in particular, e.g., be a corrosion resistant layer CRL with repect to oxidation (oxidation barrier layer OxBL), a thermal barrier layer ThBL, a chemical barrier layer ChBL or a wear resistant layer WRL or a hydride-forming layer HyfL for hydrogen storage functions.

In the simple-most approach, only the hydrogen permeation barrier layer HPBL consisiting of an, e.g., ternary or quaternary oxide as described above, is deposited at the substrate surface (only layer L1).

For more demanding applications, an adhesion layer as layer L1 is formed between the substrate SUB and the hydrogen permeation barrier layer HPBL (layer L2).

In more elaborate versions, the adhesion layer AdhL (as layer L1) could be combined with a hydrogen permeation barrier layer HPBL (as layer L2) and an additional layer 3 L3 on top, which may act, e.g., as a corrosion resistant layer CRL, as a wear resistant layer WRL or as a thermal barrier layer ThBL. As already mentioned, one of these layers L1, L2, L3 may have also hydrogen storage functionality (hydrogen storage layer HStL). For example, it is possible to deposit as layers L1 and L2 or as L2 and L3 or as L1 and L3 a hydrogen permeation barrier layer HPBL and a hydrogen storage layer HStL, respectively. This way, it should be possible to store hydrogen while largely avoiding that hydrogen excapes through or into the substrate SUB. For other applications, it may, nevertheless, be preferable to exactly exchange the before-mentioned positions of hydrogen permeation barrier layer HPBL and hydrogen storage layer HStL, e.g., if the hydrogen shall enter and/or leave the hydrogen storage layer HStL through the substrate.

In one example, a hydrogen storage layer HStL is arranged between said adhesion layer AdhL and said hydrogen permeation barrier layer HPBL.

In another example, a hydrogen storage layer HStL is alternatively or additionally arranged between hydrogen permeation barrier layer HPBL and protective layer ProtL.

In another example, a hydrogen storage layer is, alternatively or additionally, arranged on top of said protective layer ProtL.

In another example, the layer system comprises at least one sequence of a hydrogen permeation barrier layer HPBL and a hydrogen storage layer HStL.

In another example, the layer system comprises at least one sequence of a hydrogen permeation barrier layer HPBL, a hydrogen storage layer HStL and a protective layer ProtL.

It is to be kept in mind that one (physical) layer (such as L1, L2, L3) may have more than one functionality, e.g., it can be, at the same time, a hydrogen permeation barrier layer HPBL, a thermal barrier layer ThBL, and a chemical barrier layer ChBL.

FIG. 5 schematically shows an apparatus comprising a sealable volume V and a wall W forming at least a portion of the boundary limiting said volume V. Said wall W comprises a hydrogen permeation barrier in form of a layer system LS; accordingly, wall W substantially corresponds to an above-mentioned substrate SUB (plus layer system LS). Layer system LS is one of the above-described kind. A seal S is indicated; in place thereof, a valve could be provided. Outside of the volume V, there is another volume V∝, wherein the two volumes V, V' are separated from each other by the wall W. The hydrogen density of the two volumes V, V' will usually be different. E.g., liquid hydrogen or hydrogen at high pressure is contained in volume V in the apparatus A, whereas the outside volume V' contains only traces of hydrogen, and the escape of hydrogen from the apparatus A to volume V' shall be minimized by the layer system LS. Various examples, what the apparatus A can be, have been given before in this patent application. Note that the invention is of relevance for applications regarding any aspect of hydrogen, in particular of any aspect of hydrogen production and utilization.

In summary, the invention may have at least one of the following advantages:
- It allows to form thin hydrogen permeation barriers on nearly any metallic and ceramic substrate.
- The layer system can combine layers with permeation barrier properties, mechanical-wear-resistant properties, electrical properties and layers with the capability to store and release hydrogen or with other properties (see above).
- The layer system can be deposited in one single deposition process involving a large variety of substrate sizes and materials.
- The layer system can be deposited on large substrates, e.g., of more than 500 cm$^2$.
- The layer system can be deposited with high reproducibility and homogeneity (of thickness).
- PRF of more than 1000 are readily achieved.
- Efficient hydrogen permeation barriers have been demonstrated for coating thicknesses of at least ternary oxides between 10 nm and 10 μm.
- The hydrogen permeation barrier is thermally stable above 200° C., preferably above 400° C., preferably above 600° C.
- The mechanical properties of the permeation barrier of the invention can be tailored in hardness.
- The morphology of the hydrogen permeation barrier can be tailored by process parameters of the deposition process, in particular by the oxygen flow.
- All the phases (from XRD-amorphous to corundum-type) of the Al—Cr—O material system show outstanding permeation barrier properties.
- The flexibility of the PVD deposition technique, especially of arc evaporation, allows an application of the thin layer system not only for fusion reactors but also for the other applications mention above.
- The layer system can be particularly well suited for application in harsh ambiances, i.e. at high temperatures and/or in aggressive chemical environments. In such environments, the layer system can effectively function as a hydrogen permeation barrier, as a chemical barrier, as an oxidation barrier and as a diffusion barrier.

The layer system can well be applied in fusion technology, where barrier properties with respect to toxic materials, in particular regarding tritium, are of particular interest.

In comparison to the known state of the art, the invention may have one or more of the following benefits:

Much higher temperature stability than any polymer-based approach.

Alloying of the substrates with hydride-forming dopants and the complicated procedure of the alloy forming process (at high temperature, above 1000° C.) not necessary.

Avoiding the complicated electrochemical approach having a complicated layer design.

Avoiding the high substrate temperature and the complicated technology for the deposition of $\alpha$-$Al_2O_3$.

Uncomplicated synthesis of multi-purpose layer stacks (permeation barrier, hydrogen storage, wear resistance, oxidation barrier, diffusion barrier, thermal barrier, . . . ) by an industrial PVD production technology Much better hydrogen permeation barrier properties compared to plasma nitridation.

REFERENCES

1. K. Verghese, L. R. Zumwalt, C. P. Feng, T. S. Elleman, J. Nucl. Mater. 85&86 (1979) 1161.
2. K. S. Forcey, D. K. Ross, J. Nucl. Mater. 182 (1991) 36.
3. G. W. Hollenberg, E. P. Simonen, G. Kalinin, A. Terlain, Fusion Eng. Des. 28 (1995) 190.
4. D. Levchuk, F. Koch, H. Maier, H. Bolt, J. Nucl. Mater. 328 (2004) 103.
5. D. Levchuk, S. Levchuk, H. Maier, H. Bolt, A. Suzuki, J. Nucl. Mater. 367-370 (2007) 1033.
6. M. Fink, C. Löcker, J. Laimer, C. Mitterer, H. Störi, Surf. Coat. Technol. 188-189 (2004) 281.
7. J. Laimer, M. Fink, C. Mitterer, H. Störi, Vacuum 80 (2005) 141.
8. S. Ruppi, A. Larrson, Thin Solid Films 388 (2001) 50.
9. R. Brill, F. Koch, J. Mazurelle, D. Levchuk, M. Balden, Y. Yamada-Takamura, H. Maier, H. Bolt, Surf. Coat. Technol. 174-175 (2003) 606.
10. O. Kyrylov, D. Kurapov, J. M. Schneider, Appl. Phys. A80 (2005) 1657.
11. J. Ramm, M. Ante, H. Brändle, A. Neels, A. Dommann, M. Döbeli, Advanced Engineering Materials 9 (2007) 604.
12. J. Ramm, M. Ante, T. Bachmann, B. Widrig, H. Brändle, M. Döbeli, Surf. Coat. Technol. 202 (2007) 876.
13. B. van der Schaaf, D. S. Gelles, S. Jitsukawa, A. Kimura, R. L. Klueh, A. Möslang, G. R. Odette, J. Nucl. Mater. 283-287 (2000) 52.
14. L. R. Doolittle, Nucl. Instr. and Meth. B15 (1986) 227.
15. International Standard ISO 14577-1, Metallic materials—Instrumented indentation test for hardness and materials parameters, Part 1: Test methods, 2002.
16. P. J. Martin, A. Bendavid, Thin Solid Films 394 (2001) 1.
17. R. L. Boxman and V. N. Zhitomirsky, Rev. Sci. Instrum. 77 (2006) 021101.

LIST OF REFERENCE SYMBOLS

A apparatus
AdhL adhesion layer
ChBL chemical barrier layer
CRL corrosion resistant layer
HPBL hydrogen permeation barrier layer, hydrogen barrier layer
HyfL hydride-forming layer
HStL hydrogen storage layer
L1, L2, L3 layer
LS layer system
OxBL oxidation barrier layer
ProtL protective layer
S seal
SUB substrate, wall, part of reactor, of combustion engine, of fuel cell
ThBL thermal barrier layer
V,V' volume
W wall
WRL wear resistance layer

The invention claimed is:

1. An apparatus comprising a wall and a seal, wherein the seal and an interior surface of the wall define a sealed volume, wherein said wall comprises a layer system on said interior surface comprising a hydrogen barrier layer formed from a ternary or quaternary oxide comprising Al and O, wherein the hydrogen barrier layer is configured to maintain a hydrogen density in said volume that is different than a hydrogen density outside of said volume, wherein said hydrogen barrier layer is formed via a physical vapor deposition method, wherein droplets formed by arc evaporation are distributed in the hydrogen barrier layer.

2. The apparatus according to claim 1, wherein said ternary oxide is substantially composed of Al, Cr and O.

3. The apparatus according to claim 1, wherein said layer system comprises at least one of the group consisting of an adhesion layer for increasing an adhesion of said hydrogen barrier layer on a substrate;
a hydrogen storage layer capable of storing and releasing hydrogen;
a protective layer for protecting at least one layer of said layer system from external influences.

4. The apparatus according to claim 1, wherein said apparatus is or comprises at least one of the group consisting of a hydrogen storage container;
a hydrogen transport container;
a fusion reactor;
a fuel cell;
a battery;
a combustion engine;
a superconducting electricity-grid;
an electric transmission cable;
a fuel tank.

5. The apparatus according to claim 1, wherein the layer system includes a second layer comprising a hydrogen storage layer comprising a hydride precursor.

6. The apparatus according to claim 1, further comprising a protecting layer overlaying the hydrogen barrier layer.

7. Method for manufacturing an apparatus according claim 1, characterized in comprising the step of B) depositing said hydrogen barrier layer on said wall.

8. A hydrogen permeation barrier, comprising a wall and a seal, wherein the seal and an interior surface of the wall define a sealable volume, and a layer system on said interior surface that encloses the sealable volume in which a hydrogen density is established, the layer system comprising a hydrogen barrier layer comprising a ternary or quaternary oxide comprising Al and 0 that isolates the hydrogen density within the sealable volume from a volume having a different hydrogen density externally of said sealable volume, wherein the hydrogen barrier layer is formed via a physical vapor deposition method, wherein droplets formed by arc evaporation are distributed in the hydrogen barrier layer.

9. The hydrogen permeation barrier according to claim 8, wherein said ternary oxide is substantially composed of Al, Cr and O.

10. The hydrogen permeation barrier according to claim 8, wherein said layer system comprises at least one of the group consisting of
- an adhesion layer for increasing an adhesion of said hydrogen barrier layer on a substrate;
- a hydrogen storage layer capable of storing and releasing hydrogen;
- a protective layer for protecting at least one layer of said layer system from external influences.

11. The hydrogen permeation barrier according to claim 8, wherein the layer system includes a second layer comprising a hydrogen storage layer comprising a hydride precursor.

12. The hydrogen permeation barrier according to claim 8, wherein the physical vapor deposition is carried out using an arc-evaporation method.

13. An apparatus comprising a wall and a seal, wherein the seal and an interior surface of the wall define a sealed volume, wherein the wall comprises a layer system on the interior surface comprising a hydrogen barrier layer formed from a ternary or quaternary oxide comprising Al and O, wherein a hydrogen density in the sealed volume is different than a hydrogen density outside of the sealed volume, wherein droplets formed by arc evaporation are distributed in the hydrogen barrier layer.

* * * * *

UNITED STATES PATENT AND TRADEMARK OFFICE
CERTIFICATE OF CORRECTION

| | | |
|---|---|---|
| PATENT NO. | : 11,485,543 B2 | Page 1 of 1 |
| APPLICATION NO. | : 14/147743 | |
| DATED | : November 1, 2022 | |
| INVENTOR(S) | : Jurgen Ramm | |

It is certified that error appears in the above-identified patent and that said Letters Patent is hereby corrected as shown below:

In the Specification

In Column 16, Line 17, please replace "another volume Va," with -- another volumn V', --

Signed and Sealed this
Twenty-eighth Day of May, 2024

*Katherine Kelly Vidal*

Katherine Kelly Vidal
*Director of the United States Patent and Trademark Office*